United States Patent
Bailey et al.

(10) Patent No.: US 8,705,595 B2
(45) Date of Patent: Apr. 22, 2014

(54) DIGITAL OUTPUT POWER MEASUREMENT IN RADIO COMMUNICATION SYSTEMS

(75) Inventors: Kris Bailey, Ottawa (CA); Slim Ben Ghalba, Ottawa (CA); Peter Zahariev Rashev, Calgary (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 322 days.

(21) Appl. No.: 13/102,304

(22) Filed: May 6, 2011

(65) Prior Publication Data

US 2012/0281772 A1 Nov. 8, 2012

(51) Int. Cl.
*H04L 27/00* (2006.01)

(52) U.S. Cl.
USPC ........... 375/221; 375/219; 375/297; 375/345; 375/347; 455/73

(58) Field of Classification Search
USPC ..................... 375/219, 221; 455/73
See application file for complete search history.

(56) References Cited

U.S. PATENT DOCUMENTS

| 7,012,968 | B2 | 3/2006 | Kim et al. |
| 7,333,567 | B2 | 2/2008 | Ma et al. |
| 2006/0067427 | A1 | 3/2006 | Zolfaghari et al. |
| 2009/0285330 | A1 | 11/2009 | Premakanthan et al. |
| 2011/0085589 | A1* | 4/2011 | Filipovic et al. ............... 375/224 |
| 2011/0201287 | A1* | 8/2011 | Pratt et al. ...................... 455/126 |

FOREIGN PATENT DOCUMENTS

| WO | WO2004/098045 A1 | 11/2001 |
| WO | WO2006/066628 A1 | 6/2006 |
| WO | WO2008/074158 A1 | 6/2008 |

OTHER PUBLICATIONS

PCT/IB2012/051499 International Search Report.

* cited by examiner

*Primary Examiner* — Shuwang Liu
*Assistant Examiner* — Ross Varndell
(74) *Attorney, Agent, or Firm* — Jean-Pierre Fortin; Ericsson Canada Inc.

(57) ABSTRACT

Devices and methods related to devices capable to perform digital output power measurement besides attenuation control are provided. A device includes a digital signal processing unit, a transmitter and a feedback receiver. The digital signal processing unit is configured to control attenuation along a transmission path and a feedback path based on a comparison of a power of a digital input signal with a raw power of a corresponding digital feedback signal, and to calculate an output power value of an analog RF signal to be broadcasted, using the raw power of the digital feedback signal and one or more feedback gain factors related to gain in the feedback receiver.

21 Claims, 6 Drawing Sheets

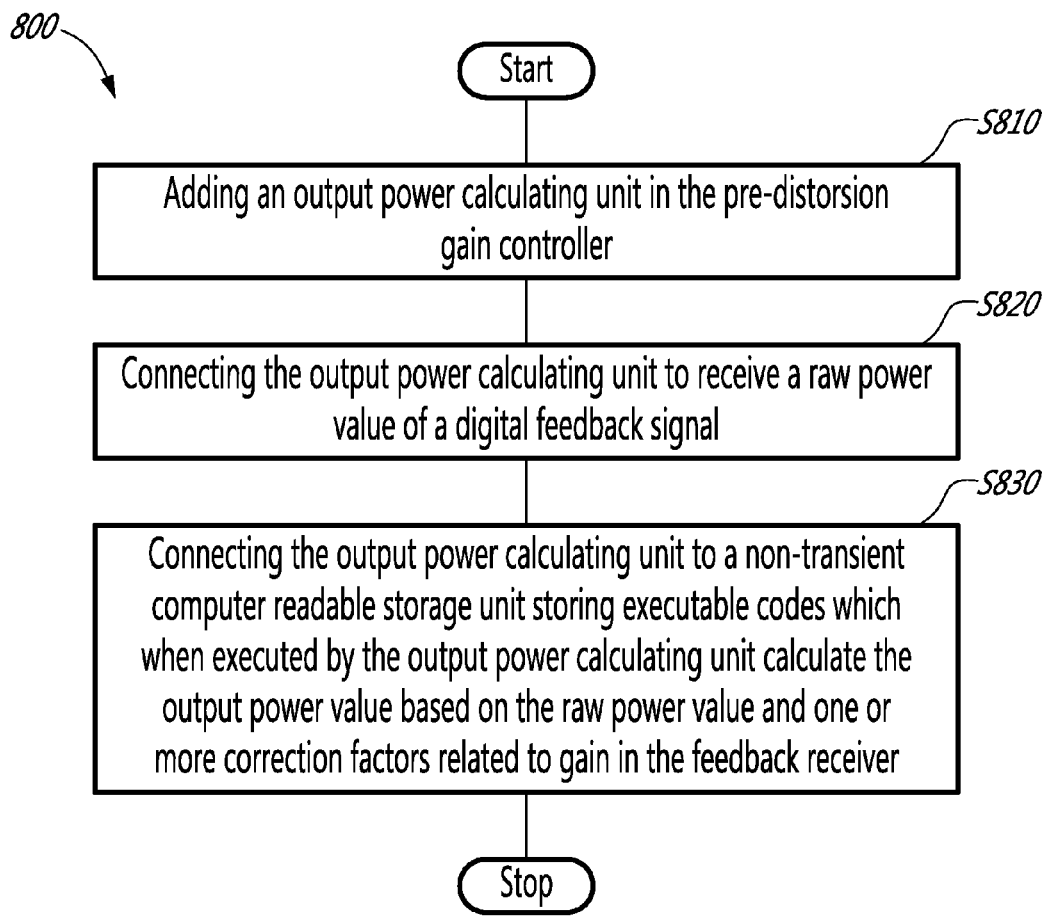

DIGITAL OUTPUT POWER MEASUREMENT IN RADIO COMMUNICATION SYSTEMS

TECHNICAL FIELD

The present invention generally relates to radio communications systems, and, in particular, to methods and devices that achieve a digital measurement of a power output in parallel with power level monitoring.

BACKGROUND

In a radio communication system, information embedded in electrical signals is broadcasted and intercepted via antennas that convert the electrical signals into and from electromagnetic signals. The power output by an antenna as electromagnetic signals is an important factor in determining the antenna's coverage area or transmission range (i.e., an area within which other devices of the radio communication systems may intercept electromagnetic signals useable for extracting the information therein).

In order to support radio-communications with a large number of devices which are within its transmission range, a base station will typically transmit and receive signals on a number of different channels. Thus, the signals are an overlap of components with different frequencies (i.e., corresponding to different channels). The components (i.e., signals on different channels) may be subject to different gains, while processed and converted into electromagnetic signals. Achieving a uniform gain for all the signal components is desirable for a good transmission quality. The uniform gain may be achieved by pre-distorting the initial signal. Obtaining and maintaining a good transmission quality is based on continuously monitoring and improving the output signal.

The adaptive control in wireless technology often includes accurate measurements of the radio frequency (RF) power output from an antenna of a cellular base-station. Besides enabling to control and regulate the actual RF power level accurately, these measurements may be used for performance measurement, monitoring and supervisory functions (e.g., a voltage standing wave ratio—VSWR—measurement).

It is a challenge to maintain the accuracy of the RF power output measurement over the power range, the frequency range, the operating temperature range and for different waveform characteristics (e.g., different peak-to-average power ratios, constantly changing average amplitudes over the frequency spectrum, varying average and peak power levels with time, etc).

Currently, analog output power measurement methods are frequently used to measure the power output, because analog root-mean-square (RMS) power detector integrated circuits (IC) devices are widely available from several IC component vendors at low cost. The analog RMS power detector IC device outputs a voltage proportional to a measured power, typically extracted from a forward directional coupler at the transmitter RF output. This voltage may be digitized and converted into a measured power value by a software calculation using a response characteristic equation, or using a calibrated look-up-table. Further, a result of a power output measurement may be calculated as an average over many samples.

However, the analog output power measurement accuracy is limited by the precision of converting the voltage into a measured power value, while taking into consideration the fairly high variation of the output voltage due to temperature and frequency. This precision is determined by the complexity and sensitivity of determining the coefficients of the response characteristic equation or the look-up table content. These types of determinations are part of the factory calibration associated with each analog RMS power detector IC device. In this context, cost and time (i.e., duration of the factory calibration) are of essence, limiting the precision. Another limitation affecting analog output power measurement accuracy is the variation of the analog RMS power detector IC device's response for different waveform amplitudes vs. frequency, and amplitude/frequency spectrums vs. time.

An alternative to using analog RMS power detector IC devices is using a digital method in which a portion of the RF power output is processed by analog to digital conversion, quadrature amplitude demodulation, filtering, and measuring power level by calculating the root means square of the sum of squared components, and averaging over multiple samples. Such a method overcomes many of the deficiencies of the analog methods, in particular, the ones regarding reducing the variation in response for frequency and temperature, and removing the variation due to operating power average and waveform characteristics. However, in these methods, additional circuitry becomes necessary to perform down-conversion of the portion of the RF power output to an intermediate frequency, the analog to digital conversion, quadrature amplitude demodulation, etc. This additional circuitry is prohibitive from cost and space point of view.

Methods that reuse existing digital feedback receivers in devices with digitally controlled transmitters may provide a cost effective solution, but an extensive factory calibration and characterization of the involved RF components becomes necessary in order to achieve the desired measurement accuracy. Mapping of RF gains to baseband power readings is difficult from the point of view of the calibration complexity and time, as well as regarding an overall measurement robustness in order to achieve and reliably maintain the required measurement accuracy.

Accordingly, it would be desirable to provide methods and devices for measuring the output power of a device in a radio communication system that avoid the afore-described problems and drawbacks.

ABBREVIATIONS/ACRONYMS

ADC Analog-to-Digital Converter
ASIC Application Specific Integrated Circuit
DAC Digital-to-Analog Converter
dB decibel
dBm decibels above one milliwatt
FB Feed Back
FPGA Field Programmable Gate Array
IC Integrated Circuit
LO Local Oscillator
LPF Low Pass Filter
QAM Quadrature Amplitude Modulation
RF Radio Frequency
RMS Root Mean Squared
SQRT Square Root
Tx Transmit
VSWR Voltage Standing Wave Ratio

SUMMARY

Some embodiments implement a digital measurement of the output power using hardware configured to control attenuation using a digital feedback, to provide a more accurate and easier to calibrate output power measurement than the conventional analog output power detectors, and a cheaper and more effective solution than dedicated digital output power detectors.

According to one exemplary embodiment, there is a device having a digital signal processing unit, a transmitter and a feedback receiver. The digital signal processing unit is configured to receive a digital input signal, and to process the digital input signal including channelization. The transmitter, which is located on a transmission path, is connected to the digital signal processing unit, and is configured to receive the processed digital signal and to convert the digital signal in an analog Radio Frequency (RF) signal to be broadcasted. The feedback receiver, which is located on a feedback path, is connected to the digital signal processing unit and is configured to receive an analog RF feedback signal corresponding to the analog RF signal to be broadcasted, to process and to convert the analog RF feedback signal into a digital feedback signal. The digital signal processing unit is further configured to control attenuation along the transmission path and the feedback path based on a comparison of a power of the digital input signal with a raw power of the corresponding digital feedback signal, and to calculate an output power value of the analog RF signal to be broadcasted, using the raw power of the digital feedback signal and one or more feedback gain factors related to gain in the feedback receiver.

According to another embodiment, a method of calculating an output power value of an analog RF signal to be broadcasted is provided. The method includes (1) inputting a digital transmission signal, (2) converting, along a transmission path, the digital transmission signal into the analog RF signal to be broadcasted, (3) sampling, from the transmission path, an analog RF feedback signal corresponding to the analog RF signal to be broadcasted, (4) converting the analog RF feedback signal into a digital feedback signal in a feedback receiver, (5) calculating a raw power value of the digital feedback signal, and (6) calculating an output power value of the analog RF signal to be broadcasted, using the raw power value, a current temperature in the feedback receiver, an operating frequency, and one or more factors related to gain in the feedback receiver.

According to another embodiment, a method of adapting a device configured to broadcast an analog RF signal carrying information of a digital input signal, and having a feedback receiver connected on a feedback path to a digital gain controller, the digital controller adjusting gain on the feedback path and on a transmission path along which the analog RF signal to be broadcasted is generated based on the digital input signal, the device being adapted to become able to perform a digital measurement of an output power value of the analog RF signal to be broadcasted is provided. The method includes adding an output power calculating unit in the gain controller and connecting the output power calculating unit to receive a raw power value of a digital feedback signal. The digital feedback signal is received in the digital controller from the feedback path, the digital feedback signal being generated from a feedback RF analog signal that is provided in the feedback receiver by sampling the analog RF signal to be broadcasted on the transmission path. The method also includes connecting the output power calculating unit to a non-transient computer readable storage unit storing executable codes which when executed make the output power calculating unit to calculate the output power value based on the raw power value and one or more correction factors related to gain in the feedback receiver. The method further includes adding signal comparison equipment in the digital controller and connecting the signal comparison equipment to receive the digital input signal and the digital feedback signal, and to the output power calculating unit. Some of the executable codes make the output power calculating unit to perform a calibration of at least one of the correction factors using an output of the signal comparison equipment.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 6 is a flow diagram of a method of retrofitting a device having a feedback receiver and a gain controller to perform a digital output power measurement, according to another embodiment.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of a cellular base station configured to continuously monitor an output power level. However, the embodiments to be discussed next are not limited to these systems but may be applied to other existing systems.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification is not necessarily all referring to the same embodiment. Further, the particular features, structures or characteristics may be combined in any suitable manner in one or more embodiments.

In the current cellular base-stations, a transmitter frequently uses a pre-distorter for gain linearization and performs monitoring and control of the transmitter or antenna outputs. These functions are achieved in a digital control loop closed from an observation point of interest along the transmission path by a digital feedback receiver along a feedback path. In some embodiments described below, the digital feedback loop is also used to perform a digital output power measurement with very little interruption in its main function of monitoring the signal level.

In such a digital output power measurement, it is important to account for the feedback receiver's gain value, which may be affected by various gain adjustments, the operating temperature and the operating frequency. Therefore, a normal operation of the digital control loop may be briefly interrupted to calibrate the feedback receiver gain values used in calculating the output power value. Such a calibration may be triggered when any of the analog feedback attenuator value, the transmit center frequency, and the feedback receiver temperature changes substantially since a previous calibration. This interruption occurs rarely since the transmit frequency is normally set only once during initial power up, the temperature, and analog feedback attenuator value typically changing infrequently.

Figure 1:
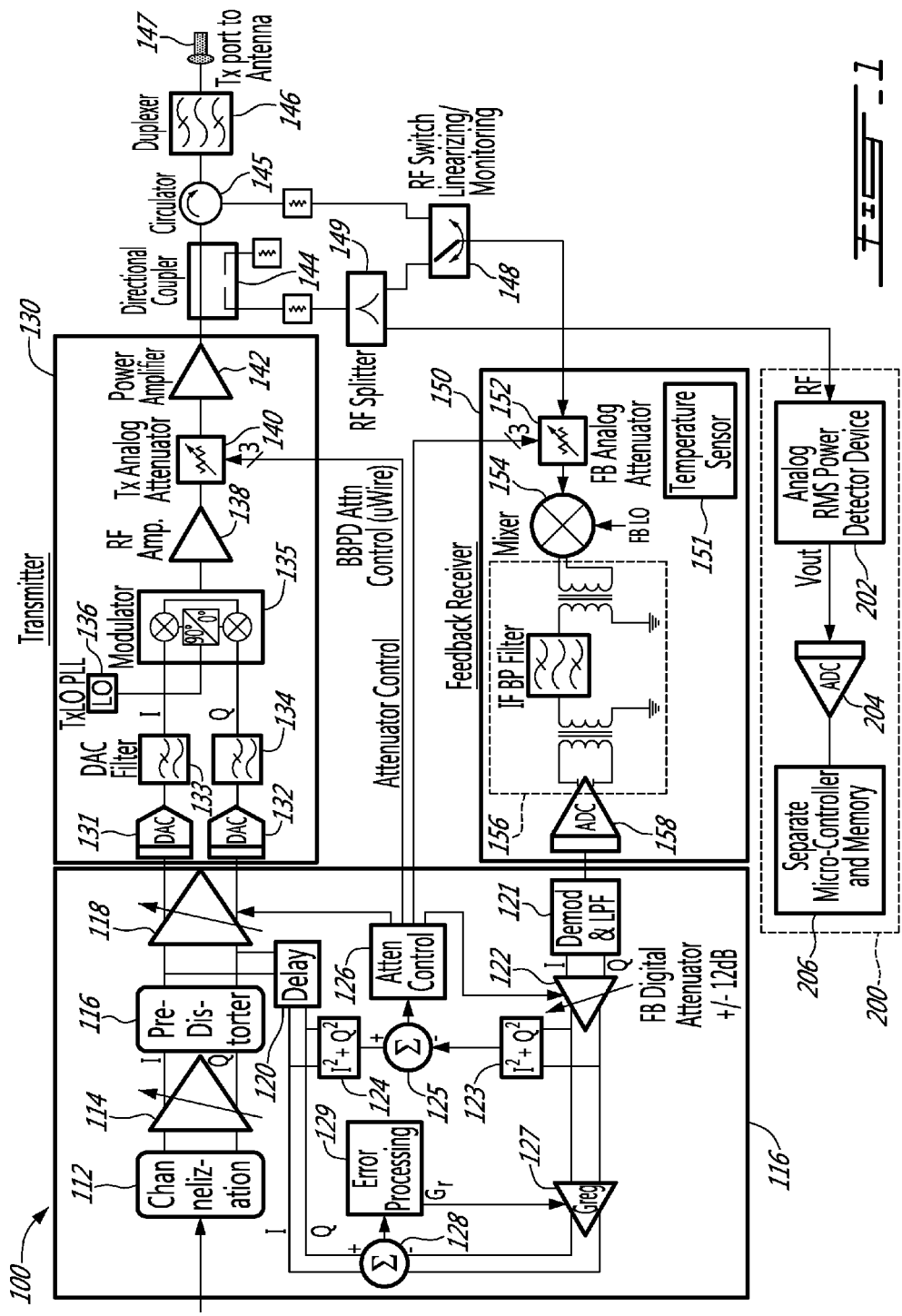
FIG. 1 is a schematic diagram of a cellular base station using an analog RMS power detector.

FIG. 1 illustrates a schematic diagram of a typical cellular base station 100 using an analog RMS power detector 200. The cellular base station 100 includes a controller 110 (which is a digital signal processing unit), a transmitter 130, and a feedback receiver 150. A digital signal carrying information may be received from a baseband/modem unit (not shown) via an optical fiber to a channelization block 112, which is a high speed interface that is realized as a pipeline of cascading operations, performing spectrum shaping, sample rate change and power adjustment on the received signal, to output an I information carrier signal and a Q information carrier signal. The I and Q signals may be attenuated in a first transmission digital attenuator 114, having, for example a range of −48 dB to 3 dB.

The digital I and Q signals are then subject to pre-distortion in block 116. The pre-distortion inversely models the frequency dependence of the gain along the transmission path to ensure that the overall system is linear. The I and Q signals output from the pre-distortion in block 116 are split into a first part subjected to a transmission gain digital fine adjustment in a second attenuator 118 and a second part entering a delay circuit 120 to be compared with corresponding digital feedback signals. The I and Q signals output from the second attenuator 118 are input to the transmitter 130.

In the transmitter 130, the I and Q signals are converted into analog signals by digital-to-analog converters (DAC) 131 and 132, respectively, and filtered by filters 133 and 134 before being input to a modulator 135. The modulator 135 combines in quadrature the analog signals I and Q using a phase locked local oscillator 136. The combined analog signal then passes through an RF amplifier 138, a variable analog attenuator 140 (that may have a range of 0-31 dB) and a power amplifier 142 before being output from the transmitter 130. Then, the analog signal enters a directional coupler 144, a circulator 145 and a duplexer 146 to the antenna 147.

The circulator 145 feeds a signal (corresponding to the transmitted signal) reflected from the antenna 147 to the feedback receiver 150 depending on a state of an RF switch 148. The RF switch 148 may intermittently enable the reflected signal to reach the feedback receiver 150. When the signal is sent back to the directional coupler 144, the RF splitter 149 sends a part of the signal to the analog RMS power detector 200.

The analog RMS power detector 200 may include an analog RMS detector device 202 that receives the RF signal and outputs a voltage proportional to the power of the RF signal, an analog to digital converter (ADC) 204 and a processing unit 206 having its separate micro-controller and memory.

The feedback receiver 150 receives the analog RF feedback signal from the switch 148. The RF feedback signal is attenuated in an analog feedback attenuator 152 (that may have a range of 0-31 dB), mixed with a signal received from a feedback local oscillator (not shown) in mixer 154, then converted and filtered to an intermediate frequency in block 156, to be finally converted into a digital signal in the analog to digital converter 158. The feedback digital signal is then input to the controller 110.

In the controller 110, the feedback digital signal is demodulated and filtered in block 121 to yield feedback components I and Q. After passing through a feedback variable digital attenuator 122, the power ($I^2+Q^2$) of the feedback signal calculated in block 123 is compared with (i.e., subtracted from) the power ($I^2+Q^2$) of the delayed transmitted signal (output from delay circuit 120) calculated in block 124. The result of the power comparison is output from block 125 to a power attenuation controller 126 configured to provide input to the second variable digital attenuator 118, the analog transmission attenuator 140, the feedback analog attenuator 152 and the feedback variable digital attenuator 122. Along the transmission path and the feedback path typically are located an analog attenuator (for coarse gain adjustment in 1 dB nominal steps) and a digital attenuator (for fine gain adjustment in 0.1 dB steps).

The location along the transmission path where the input digital signal is sampled to enter the delay block 120 for power comparison may be different in different embodiments. In one embodiment, this reference signal (named "reference" here as the feedback signal is compared with this signal) may be sampled before the channelizer 112 immediately after the digital input signal enters the digital block (e.g., just after a serial link between a baseband unit (modem) on the transmission path. However, this manner of sampling the digital input signal is sub-optimal from practical system implementation point of view. In another embodiment, the reference signal is sampled after the Channelizer 112 and before the pre-distorter 116 allowing for a comparison free from non-linearities and impairments from the power amplifier (the power measurement is based on linear average gain estimation by adaptive methods, such as, Least Mean Square, and if the measured gain is nonlinear there will be inaccuracies which can be significant). In yet another embodiment, this reference signal is sampled after the pre-distorter 116 as in our example embodiment. This manner of locating the sampling point is practical from implementation point of view (to save and reuse logic, development effort, etc) and works fine in practice, but the location is again sub-optimal. Sampling the reference signal for power comparison before the pre-distorter 116 appears to be the best choice at least theoretically.

The I and Q components of the feedback signal output from the feedback variable digital attenuator 122 may also be compared with the I and Q components of the delayed transmitted signal via amplifier programmable/configurable digital gain block 127, an add circuit 128 and an error processing unit 129 to yield an estimated complex gain value $G_r$ during a calibration procedure.

Figure 2:
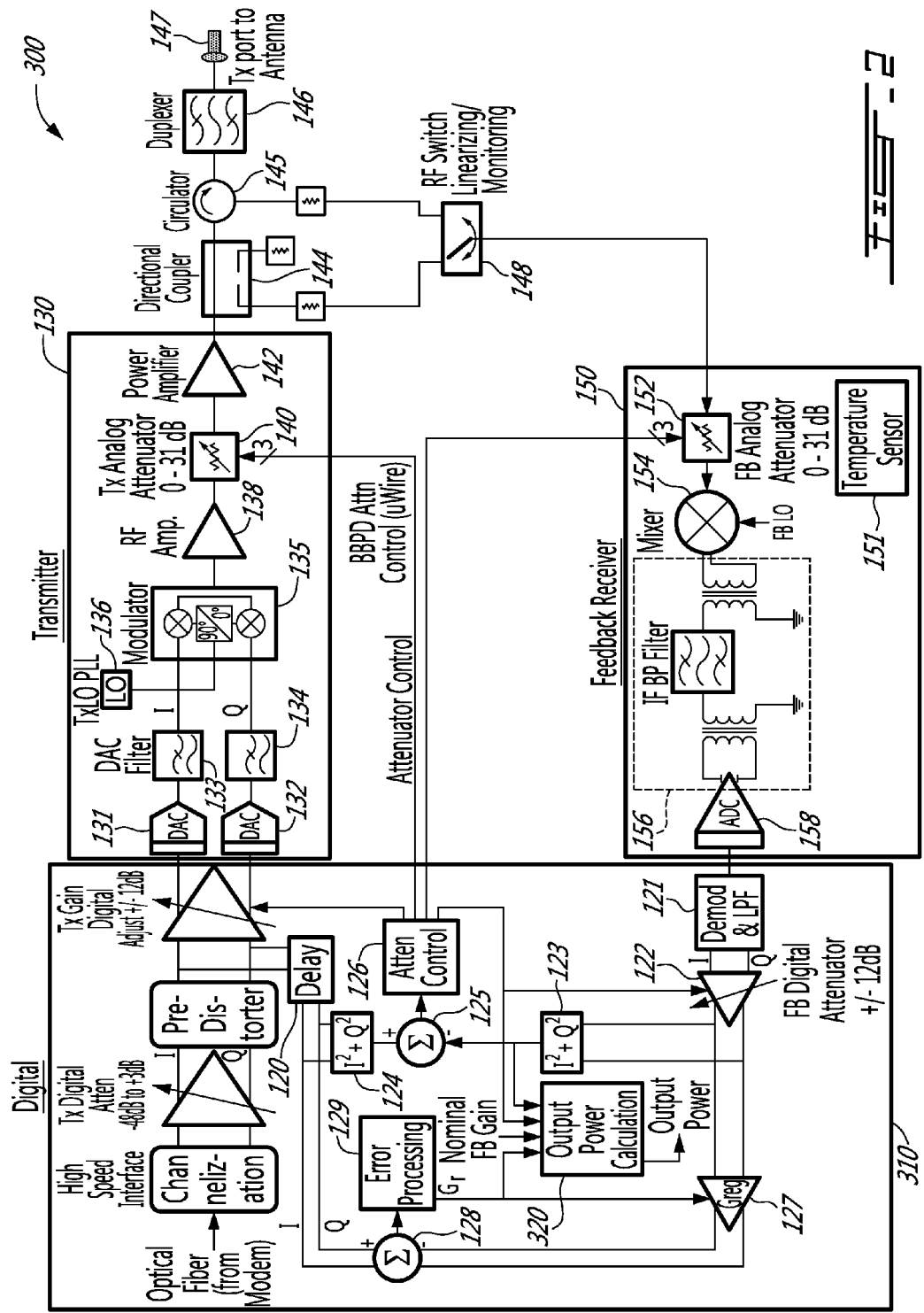
FIG. 2 is a schematic diagram of a cellular base station using a digital output power measurement, according to an embodiment.

In an embodiment of the present inventive concept illustrated in FIG. 2, a cellular base station 300 uses the feedback digital signals in a modified controller 310 (which is a digital signal processing unit) to measure the power output. The cellular base station 300 includes the modified controller 310, a transmitter 130 (similar to the transmitter in the cellular base station 100), and a feedback receiver 150 (similar to the receiver in the cellular base station 100). Typically, cellular base stations perform a pre-distorter function. However, measuring digital output power according to embodiments is not limited by presence of the pre-distortion function. The measurement may be performed in a digital signal processing unit that receives a digital feedback signal corresponding to an analog feedback signal, the analog feedback signal being sampled on the signal transmission path between the digital to analog converter and the antenna. A raw power of the digital signal (calculated, for example, as Root Mean Square of the signal components) in the digital signal processing unit is adjusted using feedback gain factors to digitally evaluate the output power of the analog RF signal to be broadcasted. The feedback gain factors may vary due to temperature variation and feedback gain tuning. Therefore the feedback gain factors may be recalibrated when considered that they may have varied significantly (e.g., when temperature in the feedback receiver has varied with more than 5° C., or when attenuation control on the feedback path resulted in a significant gain change).

The cellular base station 300 no longer includes the splitter 149 (present in the cellular base station 100) since the analog RMS power detector 200 is no longer present. The same reference numbers in FIG. 2 identify the same or similar elements of the cellular base station 300 as corresponding elements in the cellular base station 100 and the description of these elements is omitted.

In the modified controller 310, an output power calculation unit 320 is configured to calculate the output power using information already available. The information input to the power calculation unit 320 may be (i) the power ($I^2+Q^2$) of the feedback signal calculated in block 123, (ii) the nominal feedback receiver gain (NFRG), (iii) the feedback gain delta (FBGD), and (iv) the feedback digital attenuator delta (FDAD). The power calculation unit 320 yields an output power value based on the raw power value (i.e., the power ($I^2+Q^2$) of the feedback signal calculated in block 123) adjusted for gain variation in the feedback receiver (i.e., NFRG, FBGD and FDAD).

The NFRG is measured during factory calibration for different operating frequencies and temperatures, and may be fed to the output power calculation unit 320 via a software interface. The NFRG value may be corrected for a current operating frequency value and a current temperature measured in the feedback receiver 150.

The FBGD is a feedback receiver deviation and is determined during a feedback receiver gain calibration procedure. The feedback receiver gain calibration procedure includes (1) halting power amplifier linearization activities to allow an open loop operation, (2) loading feedback receiver attenuation values with the nominal factory calibration values (while storing the existing values to be put back after calibration is completed), and (3) estimating FBGD in the feedback gain delta estimation block 129. The feedback receiver gain calibration procedure exploits the condition that in normal operation the attenuation control block 126 sets attenuator values to equalize the reference and feedback power levels (as calculated in blocks 123 and 124). The value of $G_r$ is zero (i.e. gain of one) during normal loop operation (typically with different feedback attenuator values than used during factory calibration of NFRG), but has an actual FBGD value relative to the factory calibrated NFRG value, when the feedback attenuators are set to the values used during factory calibration. Hence, FBGD=(Feedback Receiver Gain at Current Attenuator Setting)/(Feedback Receiver Gain at Nominal Factory-calibrated Attenuator setting).

The FDAD is a numerical value which can be input from the attenuator controller without requiring additional calibration. Coarse adjustments of the feedback gain using increments of the analog feedback attenuator cannot be estimated exactly and therefore do require re-calibration of FBGD to maintain desired measurement accuracy. Significant changes in temperature (more than a few degrees) of the feedback receiver may also require re-calibration of the FBGD.

Then, the output power calculation unit 320 is enabled to calculate the output power using the four variables described above, continuously during normal pre-distorter operation as new digital samples are received from the feedback receiver 150 using a formula: Output Power=(Power ($I^2+Q^2$) calculated by 123)×(NFRG corrected for operating frequency and temperature)×(FBGD)×(FDAD). Here, FBGD and FDAD are calculated periodically during radio operation, and, when deemed necessary, the feedback gain estimation procedure (named "re-calibration") is performed.

The output power calculation unit 320 may be connected to a memory 330 storing programs executed by the output power calculation unit 320 to calculate the output power or to perform calibration of the feedback gain factors. The memory 330 or another computer readable storage medium capable to store non-transiently executable codes may be located inside the digital controller or connected from outside the controller.

The use of a digital output power measurement significantly impacts the factory calibration. To achieve an optimum measurement accuracy performance, all RMS power detectors (i.e. both analog and digital) require a calibration over operating frequency range and operating temperature range. However, digital RMS power detectors require calibration at a single power because their response is constant across the operating power range, while analog RMS power detectors require several calibration points because their response is not constant at all power levels.

Figure 3:
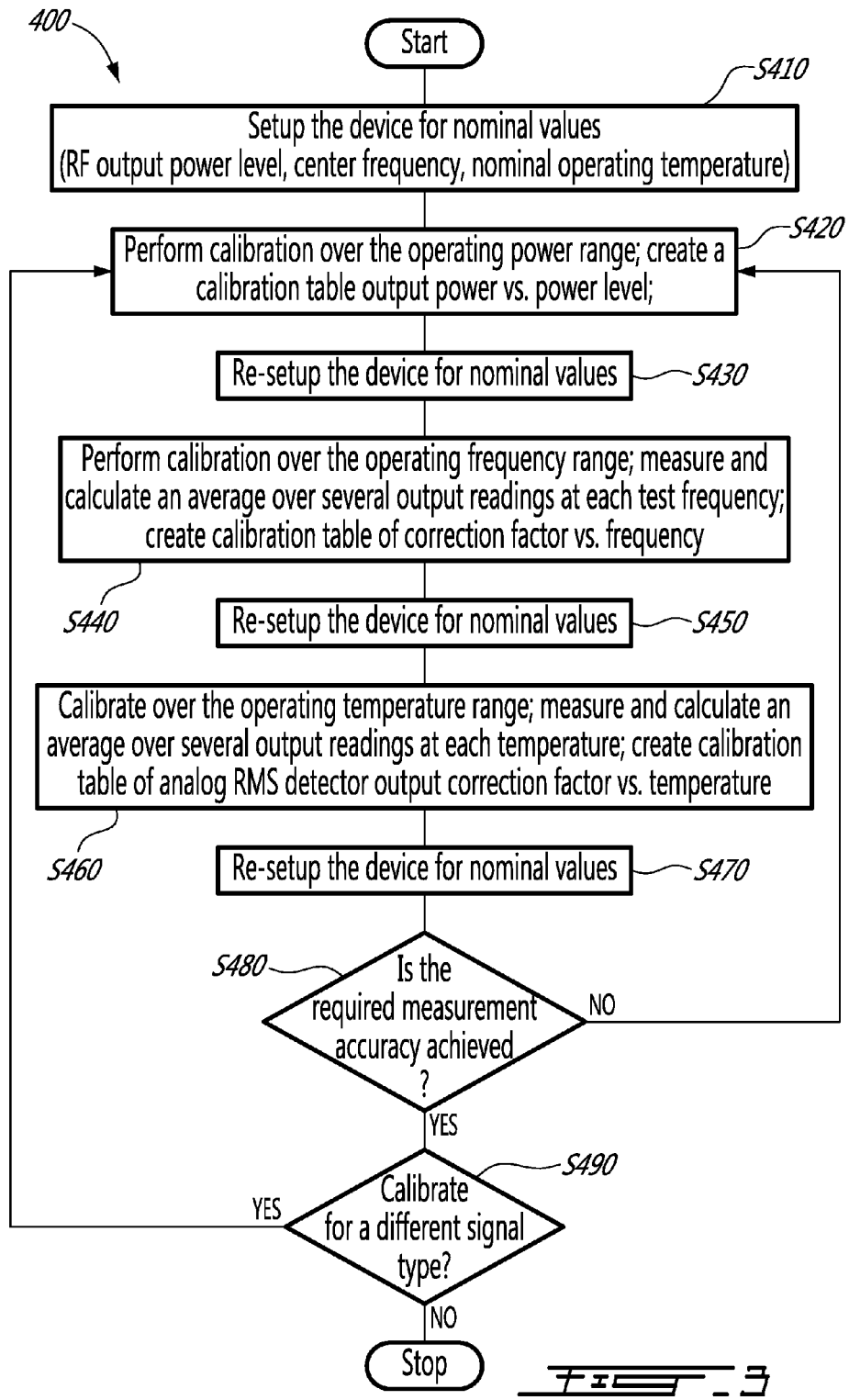
FIG. 3 is a flow diagram of a calibration procedure useable for the cellular base station of FIG. 1.

For example, a calibration procedure 400 (illustrated in FIG. 3) for a cellular base station (called "the device" in the procedure steps listed below) such as the one illustrated in FIG. 1, includes:

1. Setup the device for nominal RF output power level, center frequency, nominal operating temperature, and nominal detector receiver gain (NFRG), at S410.
2. Reduce power level for several increments over the operating power range. Measure and calculate an average over several output readings at each test power level, and create calibration table output power vs. power level, at S420.
3. Re-setup the device for nominal RF output power level, center frequency, nominal operating temperature, at S430.
4. Set frequency to several test frequency points over the operating frequency range, measure and calculate an average over several output readings at each test frequency, and create calibration table of correction factor vs. frequency, at S440.
5. Re-setup the device for nominal RF output power level, center frequency, nominal operating temperature, at S450.
6. Set ambient temperature to several temperature points over the operating temperature range. Measure and calculate an average over several output readings at each test temperature, and create calibration table of analog RMS detector output correction factor vs. temperature, at S460.
7. Re-setup the device for nominal RF output power level, center frequency, nominal operating temperature, at S470.
8. Repeat above steps (S420-S470) as required by measurement accuracy specifications with different signal types and introduce respective correction factors to already derived calibration curves for nominal signal type, at S480.
9. Set power level, frequency, and temperature, to several test points over the operating range. Select different types of waveforms for each setting. Use the RMS power detector to measure the sampled RF output power and use the calibration table data to calculate the actual power level and confirm that this calculated value against external equipment measured power is within the desired accuracy tolerance, at S490. With an analog RMS power detector method, a worst case waveform set is required: fully loaded—unloaded, full-minimal bandwidth, maximum-minimum peak-to-average-power ratio for creating a comprehensive use-cases space to verify and support consistent accuracy performance with respective correction factor(s) derived and introduced on a per case basis.

Figure 4:
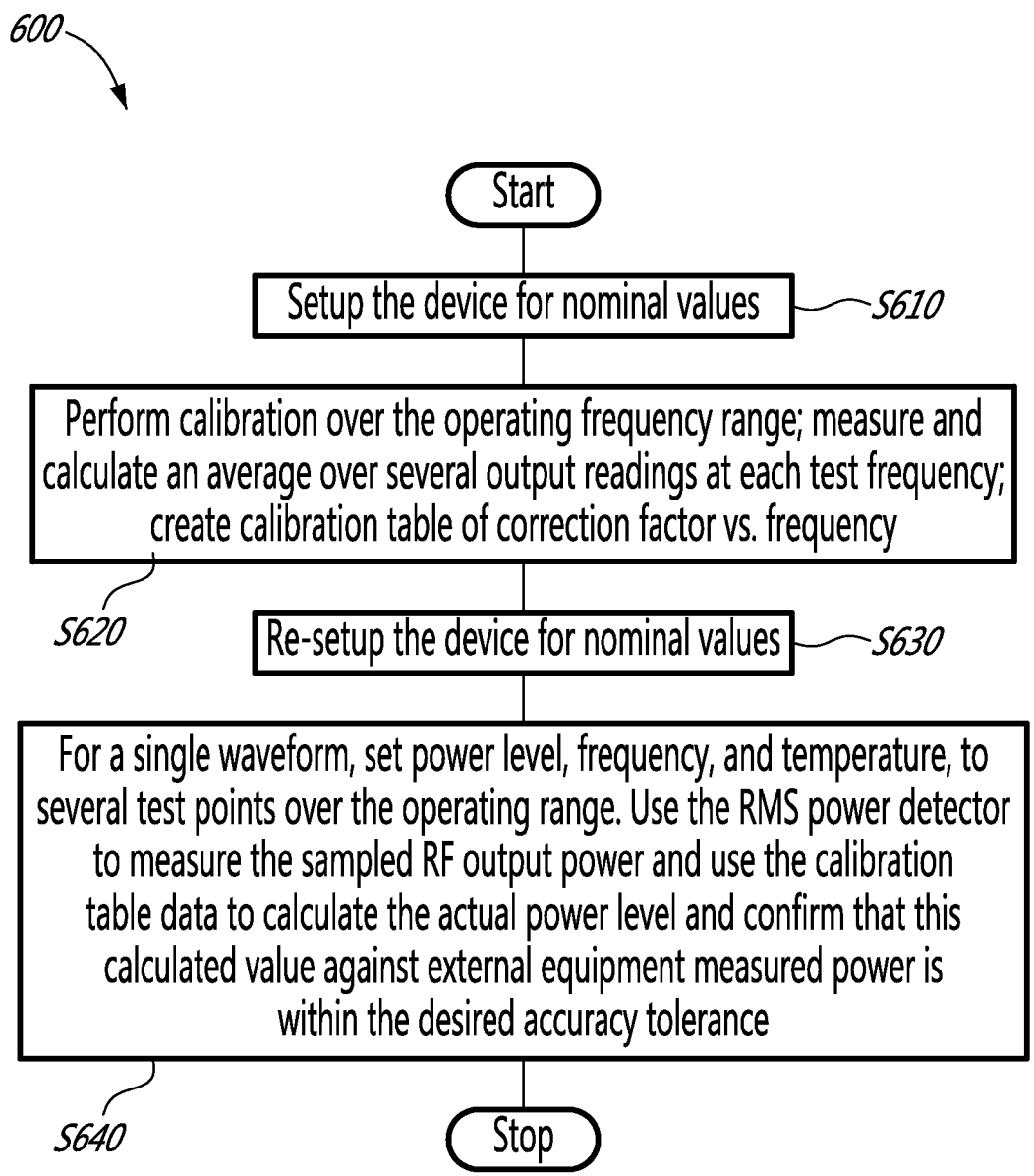
FIG. 4 is a flow diagram of a calibration procedure of a cellular base station using a digital output power measurement according to another embodiment.

In contrast, a calibration procedure 600 (illustrated in FIG. 4) for a cellular base station (called "the device" in the procedure steps listed below), such as the one illustrated in FIG. 2, includes:

1. Setup the device for nominal RF output power level, center frequency, nominal operating temperature, and nominal detector receiver gain (NFRG), at S610.
2. Set frequency to several test frequency points over the operating frequency range. However, fewer points are required compared to the device using analog output power measurement. Measure and calculate an average over several output readings at each test frequency, and create calibration table of correction factor vs. frequency, at S620. Over-temperature characterization curves of the feedback receiver may be embedded in the table of correction factor vs. frequency. These curves may be known from design or modeled based on a separate characterization.
3. Re-setup the device for nominal RF output power level, center frequency, nominal operating temperature, at S630.
4. For a single waveform, set power level, frequency, and temperature, to several test points over the operating range. Use the RMS power detector to measure the sampled RF output power and use the calibration table data to calculate the actual power level and confirm that this calculated value against external equipment measured power is within the desired accuracy tolerance, at S640.

However, the calibration of the digital RMS detector requires one new step in addition to the above listed sequence: performing a calibration of the NFRG at the nominal operating settings of RF power, frequency, and temperature. This measurement is easily performed at no increase in calibration time as part of step 2 above during the calibration over the frequency range. The calibration of NFRG provides a reference against which the device can accurately estimate the actual feedback gain observed during operation where frequency, temperature, and feedback attenuation operating parameters may all have changed relative to their nominal values.

One advantage of using a digital output power measurement is that a signal-independent, stationary and predictable receiver gain information is used to calculate dynamically varying and unpredictable signal/power level by processing at the digital end of an observation feedback receiver. The digital result is then converted into physically measurable units (dBm or Watts) at the RF point of observation, and which enables a simplified measurement and a shorter and cheaper factory calibration.

The digital output power measurement is applicable to measure RF power at any point of a transceiver line-up at which an observation feedback receiver is connected. Dedicated RF power detectors are typically connected to a single point of the line-up while observation receivers have several multiplexed points of connection. Thus, it is possible to provide power measurements at plural locations along the transceiver for improved performance monitoring and in-operation self-test.

The digital output power measurement is applicable to measure RF power in signal receivers having a feedback loop to a digital signal processing unit. Existing equipment and signal receiver line-ups connected to receive-only or transmit-receive shared antennas can be used in parallel for power measurement, since the digital method is invariant with respect to the type of receiver used and does not depend on specific direction of flow of RF power.

Additionally, the digital measurement of output power methods provide more accuracy than analog methods since no variation in measurement accuracy occurs due to the actual power level or waveform characteristics (bandwidth, air interface standard, peak-to-average ratio, payload variations, etc.). Moreover, measurement accuracy is less affected by changes in the operating frequency and temperature in the digital methods relative to the analog methods. Thus, devices using digital measurement methods have an enhanced flexibility to changes of the size of the RMS averaging in real-time without compromising the accuracy, where the size is controlled at system level (e.g., as a function of signal bandwidth, variance of reported readings, etc.), which is possible since converted to baseband and scaled copies of the actual transceiver signal.

Devices (e.g., cellular base stations) using embodiments of digital output power methods described above have a reduced cost compared to the ones using analog RMS power detectors or digital RMS power detectors built on a receiver and corresponding DSP circuitry dedicated exclusively to power detection. A digital RMS power detector using the method described herein can be integrated as a software or ASIC/FPGA code without adding hardware to existing systems used for pre-distortion and/or transceiver monitoring and control which utilize observation feedback receivers.

The devices (e.g., cellular base stations) using embodiments of digital output power methods described above have also reduced factory calibration requirements and product integration costs resulting from the gain compensation step in the method described herein which needs only one calibrated gain setting of the feedback receiver. Analog RMS detectors are calibrated over different power levels and for different types of input waveforms to achieve good measurement accuracy. The digital power detector methods using dedicated hardware (i.e., an observation receiver) depend on tabulated characterization of the observation receiver over the dynamic range and the frequency range, which are factored in to correct a digital power reading at the end of the receiver signal processing path.

Figure 5:
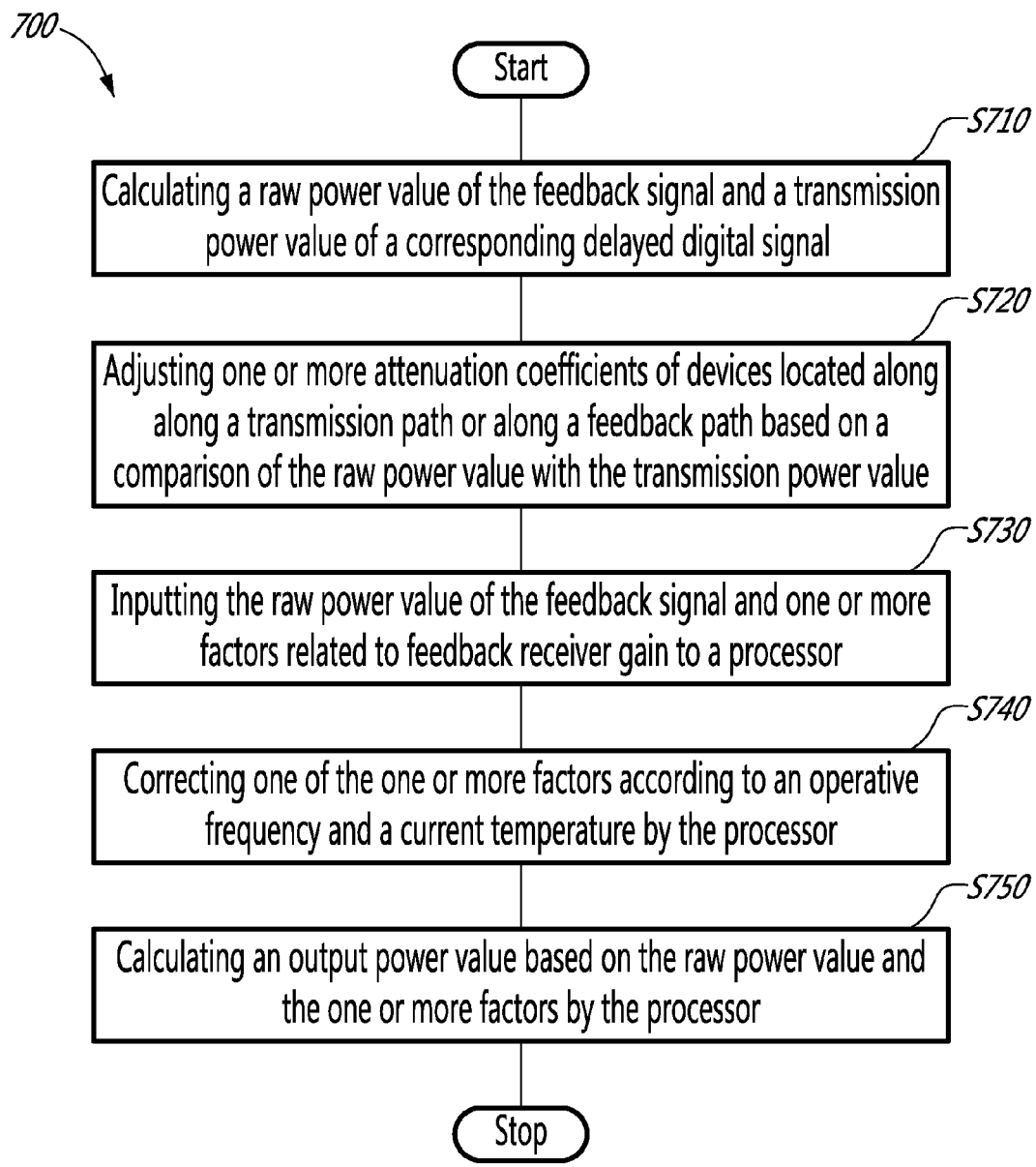
FIG. 5 is a flow diagram of a method of calculating an output power value of an analog signal broadcasted via an antenna of a device including a feedback receiver used for attenuation control according to another embodiment.

A flow diagram of a method 700 of calculating an output power value of an analog RF signal to be broadcasted is illustrated in FIG. 5. The method 700 may be executed on a device such as the one illustrated in FIG. 2. The method 700 includes:

inputting a digital transmission signal, at S710;
converting, along a transmission path, the digital transmission signal into the analog RF signal to be broadcasted, at S720;
sampling, from the transmission path, an analog RF feedback signal corresponding to the analog RF signal to be broadcasted, at S730;
converting the analog RF feedback signal into a digital feedback signal in a feedback receiver, at S740;
calculating a Root Mean Square (RMS) power value of the digital feedback signal, at S750; and
calculating an output power value of the analog RF signal to be broadcasted, using the RMS power value, a current temperature in the feedback receiver, an operating frequency, and one or more factors related to gain in the feedback receiver, at S760.

The method 700 may further include (1) modulating the digital transmission signal before being converted, (2) demodulating the digital feedback signal, and (3) controlling attenuation along the transmission path and the feedback path based on comparing a Root Mean Square (RMS) power calculation for the modulated digital transmission signal and the RMS power value of the digital feedback signal. The controlling of the attenuation may be performed more frequently than the calculating of the output power value. The method 700 may further include adjusting at least one of the one or more factors based on a recalibration procedure during which components of the digital feedback signal and of a corresponding delayed digital transmission signal are compared.

An existing device configured to broadcast an analog RF signal carrying information of a digital signal (such as, 100 in FIG. 2), and having a feedback receiver and a gain controller, can be adapted to become able to perform a digital measurement of an output power value of the analog RF signal (such as, 300 in FIG. 2). A flow diagram of a method 800 to retrofit such a device is illustrated in FIG. 6. The method 800 includes adding an output power calculating unit in the gain controller and connecting the output power calculating unit to receive a raw power value of a digital feedback signal, at S810. Further, the method 800 includes connecting the output power calculating unit to receive a Root Mean Square (RMS) power value of a digital feedback signal, at S820. The digital feedback signal is generated from an analog RF feedback signal that is provided in the feedback receiver by sampling the analog RF signal to be broadcasted on the transmission path. The method 800 also includes connecting the output power calculating unit to a non-transient computer readable storage unit storing executable codes which when executed make the output power calculating unit to calculate the output power value based on the RMS power value and one or more correction factors related to gain in the feedback receiver, at S830. Method 800 further includes, at S840, adding signal comparison equipment in the digital controller and connecting the signal comparison equipment to receive the digital input signal and the digital feedback signal, and to the output power calculating unit. Some of the executable codes make the output power calculating unit to perform a calibration of at least one of the correction factors using an output of the signal comparison equipment.

As also will be appreciated by one skilled in the art, the exemplary embodiments may be embodied in a communication device, a telecommunication network, as a method or in a computer program product. Accordingly, the exemplary embodiments may take the form of an entirely software embodiment or an embodiment combining hardware and software aspects. Further, the exemplary embodiments may take the form of a computer program product stored on a computer-readable storage medium having computer-readable instructions embodied in the medium. Any suitable computer readable medium may be utilized including hard disks, CD-ROMs, digital versatile disc (DVD), optical storage devices, or magnetic storage devices such a floppy disk or magnetic tape. Other non-limiting examples of computer readable media include flash-type memories or other known memories.

Although the features and elements of the present exemplary embodiments are described in the embodiments in particular combinations, each feature or element can be used alone without the other features and elements of the embodiments or in various combinations with or without other features and elements disclosed herein. The methods or flow charts provided in the present application may be implemented in a computer program, software, or firmware tangibly embodied in a computer-readable storage medium for execution by a specifically programmed computer or processor.

What is claimed is:

1. A device (300) for performing power measurements in a cellular base station, comprising:
    a digital signal processing unit (310) configured to receive a digital input signal and to process the digital input signal including channelization into a processed digital signal;
    a transmitter (130) located on a transmission path, connected to the digital signal processing unit (310) and configured to receive the processed digital signal and to convert the processed digital signal into an analog Radio Frequency (RF) signal to be broadcasted;
    a feedback receiver (150) located on a feedback path, connected to the digital signal processing unit (310) and configured to receive an analog RF feedback signal corresponding to the analog RF signal to be broadcasted, to process and to convert the analog RF feedback signal into a digital feedback signal, said digital signal processing unit (310) being further configured to control attenuation along the transmission path and the feedback path based on a comparison of a power of the digital input signal with a raw power value of the corresponding digital feedback signal; and
    an output power calculator unit (320) for providing an output power value based on said raw power value, said output power value being adjusted based on gain variation information received at said feedback receiver;
    wherein said raw power value is based on the power ($I^2+Q^2$) of said digital feedback signal and said gain variation information received at said feedback receiver comprises a nominal feedback receiver gain (NFRG), a feedback receiver deviation gain delta (FBGD) and a feedback digital attenuator delta (FDAD);
    wherein said FBGD is derived by halting power amplifier linearization activities of said cellular base station to allow an open loop operation loading NFRG values and estimating said FBGD in said feedback path.

2. The device of claim 1, wherein the digital signal processing unit includes a delay device configured to hold a value of the digital input signal in order to enable the comparison with the corresponding digital feedback signal.

3. The device of claim 2, wherein the digital input signal input to the delay unit is sampled before channelization.

4. The device of claim 2, wherein the digital input signal input to the delay unit is sampled after channelization.

5. The device of claim 2, wherein the digital processing unit is configured to pre-distort the digital input signal for achieving a linear relationship between the digital input signal and the analog RF signal to be broadcasted.

6. The device of claim 5, wherein the digital input signal input to the delay unit is sampled after being pre-distorted.

7. The device of claim 1, wherein the digital signal processing unit is further configured to calibrate at least one of the feedback gain factors by comparing the digital input signal and the digital feedback signal.

8. The device of claim 7, wherein the digital signal processing unit is configured to calibrate the at least one of the feedback gain factors when temperature in the feedback receiver varies more than a predetermined amount.

9. The device of claim 7, wherein the digital signal processing unit is configured to calibrate the at least one of the feedback gain factors when attenuation along the feedback path is tuned to vary more than a predetermined amount.

10. The device of claim 1, wherein the digital signal processing unit is configured to evaluate at least one of the feedback gain factors based on a nominal feedback receiver gain, an operating frequency and a current temperature in the feedback receiver.

11. The device of claim 7, wherein the digital signal processing unit is configured to determine a deviation of the at least one of the feedback gain factors from a nominal value.

12. The device of claim 7, wherein during calibration the at least one of the feedback gain factors is set to the nominal value.

13. The device of claim 1, wherein the digital signal processing unit includes a dedicated output power calculation unit configured to calculate the output power value.

14. The device of claim 1, wherein the digital signal processing unit is configured to upload software stored on a non-transient computer readable medium, which software, when executed on a processor included in a component of the digital signal processing unit, calculates the output power value.

15. The device of claim 1, wherein the digital signal processing unit calibrates the at least one feedback gain factors when at least one trigger condition is met.

16. The device of claim 1, the digital signal processing unit controls attenuation of one or more digital and/or analog attenuators located along the transmitter path and/or the feedback path.

17. The device of claim 1, wherein the analog signal and the feedback analog signal are quadrature modulated signals, being modulated and demodulated respectively along the transmission path and the feedback path, respectively.

18. A method of calculating an output power value of an analog signal to be broadcasted by a cellular base station, the method comprising:
inputting a digital transmission signal;
converting, along a transmission path, the digital transmission signal into the analog signal to be broadcasted;
sampling, from the transmission path, an analog feedback signal corresponding to the analog signal to be broadcasted;
converting the analog feedback signal into a digital feedback signal in a feedback receiver;
calculating a raw power value of the digital feedback signal; and
adjusting an output power value of the analog signal to be broadcasted, based on gain variation information received at said feedback receiver, wherein said raw power value is based on the power ($I^2+Q^2$) of said digital feedback signal and the gain variation information received at said feedback receiver comprises the nominal feedback receiver gain (NFRG), the feedback receiver deviation gain delta (FBGD) and the feedback digital attenuator delta (FDAD);
wherein said FBGD is derived by halting power amplifier linearization activities of said cellular base station to allow an open loop operation, loading NFRG values and estimating said FBGD in said feedback path.

19. The method of claim 18, further comprising:
modulating the digital transmission signal before being converted;
demodulating the digital feedback signal; and
controlling attenuation along the transmission path and the feedback path based on comparing a power calculation for the modulated digital transmission signal and the raw power value of the digital feedback signal.

20. The method of claim 19, wherein the controlling of the attenuation is performed more frequently than the calculating of the output power value.

21. The method of claim 18, further comprising:
adjusting at least one of the one or more factors based on a recalibration procedure during which components of the digital feedback signal and of a corresponding delayed digital transmission signal are compared.

* * * * *